United States Patent [19]

Goto

[11] Patent Number: 4,952,521
[45] Date of Patent: Aug. 28, 1990

[54] PROCESS FOR FABRICATING A SEMICONDUCTOR DEVICE WITH SELECTIVE GROWTH OF A METAL SILICIDE

[75] Inventor: Hiroshi Goto, Yokohama, Japan

[73] Assignee: Fujitsu Limited, Kawasaki, Japan

[21] Appl. No.: 437,337

[22] Filed: Nov. 20, 1989

Related U.S. Application Data

[63] Continuation of Ser. No. 225,619, Jul. 27, 1988, abandoned, which is a continuation of Ser. No. 855,106, Apr. 23, 1986, abandoned.

[30] Foreign Application Priority Data

Apr. 26, 1985 [JP] Japan .................. 60-0088750
Apr. 26, 1985 [JP] Japan .................. 60-0088751

[51] Int. Cl.$^5$ .................. H01L 21/283; H01L 21/331
[52] U.S. Cl. .................. 437/33; 437/192; 437/193; 437/200; 148/DIG. 19; 357/67
[58] Field of Search .................. 437/31, 32, 33, 40, 437/41, 178, 179, 192, 193, 200; 148/DIG. 19; 357/67, 34

[56] References Cited

U.S. PATENT DOCUMENTS

| | | | |
|---|---|---|---|
| 4,305,200 | 12/1981 | Fu et al. | 29/571 |
| 4,441,247 | 4/1984 | Gargini et al. | 29/571 |
| 4,451,328 | 5/1984 | Dubois | 156/656 |
| 4,528,744 | 7/1985 | Shibata | 29/571 |
| 4,551,907 | 11/1985 | Mukai | 29/571 |
| 4,569,122 | 2/1986 | Chan | 29/577 C |
| 4,581,623 | 4/1986 | Wang | 357/23.7 |
| 4,640,721 | 2/1987 | Uehara et al. | 437/968 |
| 4,648,175 | 3/1987 | Metz, Jr. et al. | 29/589 |

FOREIGN PATENT DOCUMENTS

| | | |
|---|---|---|
| 0066097 | 12/1982 | European Pat. Off. . |
| 0097918 | 1/1984 | European Pat. Off. . |
| 0124960 | 11/1984 | European Pat. Off. . |
| 55-26630 | 6/1979 | Japan . |
| 170776 | 6/1979 | Japan . |
| 57-32511 | 12/1979 | Japan . |
| 0155778 | 12/1979 | Japan . |
| 61-183199 | 8/1986 | Japan . |
| 0183199 | 8/1986 | Japan . |
| 57-34365 | 12/1987 | Japan . |

OTHER PUBLICATIONS

Sakai et al, Japanese Journal of Applied Physics, vol. 20(1981) Supp. 20-1, Tokyo, Japan, pp. 155-159.
English Summary pf 55-26630 (Kokai 54-70776).
English Summary of 57-32511 (Koka 54-155778).
English Summary of 61-183199 (Kokai 60-23480).
Broadbent et al., Solid State Science and Technology, Jun. 1984, pp. 1427-1433.
Hall et al., Tungsten and Other Refractory Metals for VLSI Applications III, MRS Proc. 1987, pp. 31-237.

Primary Examiner—Brian E. Hearn
Assistant Examiner—T. N. Quach
Attorney, Agent, or Firm—Staas & Halsey

[57] ABSTRACT

A metal or metal silicide layer (37) is selectively grown on a nucleating layer (28) with a predetermined pattern on an insulating layer and on a substrate below an opening in an insulating layer, to form a metal or metal silicide electrode in contact with the substrate external base (36) the opening and extending therefrom along the pattern of the nucleating layer. This process is advantageous in that a high electroconductive metal or metal silicide layer having a precise pattern can be easily formed.

1 Claim, 5 Drawing Sheets

PROCESS FOR FABRICATING A SEMICONDUCTOR DEVICE WITH SELECTIVE GROWTH OF A METAL SILICIDE

This is a continuation of copending application Ser. No. 225,619 filed on July 27, 1988 now abandoned which is a continuation of Ser. No. 855,106 filed Apr. 23, 1986 now abandoned.

BACKGROUND OF THE INVENTION

1. Field of the Invention

This invention relates to a process for fabrication of a semiconductor device, particularly to a process for forming electrodes or wirings by utilization of the selective growth of a metal or metal silicide.

2. Description of the Related Art

FIG. 1 is a sectional view of the pertinent portion of a bipolar transistor proposed in the prior art. In this Figure, 1 is an n-type silicon substrate for the collector region, 2 is its principal surface, 3 is a p-type base region, 4 is an n-type emitter region, 5 is a base taking-out electrode (base contact) of a polycrystalline silicon layer containing a p-type impurity, 6 and 7 are $SiO_2$ films, 8 is a base electrode, and 9 is an emitter electrode. In this bipolar transistor, the base electrode 8 is connected to the base taking-out electrode 5 of a polycrystalline silicon. Such a structure can make the area on the principal surface 2 of the base region 3 smaller as compared with the case when the base electrode 8 is connected directly onto the base region 3 without the intermediary base taking-out electrode 5.

However, even in this bipolar transistor, since the base taking-out electrode 5 consisting of a polycrystalline silicon layer is commonly formed by etching a polycrystalline silicon layer formed on the entire surface of the base region 3, the emitter region 4, and the $SiO_2$ film 6, the area occupied by the base taking-out electrode 5 on the base region 3 becomes relatively larger. Also, the area occupied by the $SiO_2$ film 7 on the regions 3 and 4 cannot help but become relatively larger for the same reason. Accordingly, there has been proposed a process for fabricating a bipolar transistor having solved these problems by self-alignment utilizing the good workability of polycrystalline silicon (Japanese Patent Publication (Kokoku) Nos. 55-26630 and 57-32511).

It is also known in the art that silicon, tungsten, etc., can be grown selectively only on the region comprising a specific substance of the substrate. As an application of this selective growth for a semiconductor device, it has been proposed, for example, to form an insulating film selectively on a silicon semiconductor substrate, followed by selective epitaxial growth of silicon only on the portion where no insulating film is formed on the silicon substrate, and utilize the selective epitaxial growth region as an active region for the formation of elements and the above insulating film as an element separating region. Also, it has been proposed to embed silicon in an electrode contact window opened in an insulating film on a silicon semiconductor body by a selective growth of silicon in the window to make the top surface of the silicon the same height as the top surface of the insulating film, followed by the formation of a wiring on the insulating film and the thus embedded silicon, thereby attempting to flatten the multi-layer wiring.

Further, although different from the selective growth method, in order to produce a symmetric bipolar transistor, it is disclosed in Japanese Unexamined Patent Publication (Kokai) No. 57-34365 to form an insulating film on a single crystalline silicon substrate, further form a thin polycrystalline silicon film thereon, followed by formation of an opening portion at the region for formation of an active region by etching the polycrystalline silicon film and the insulating film, and forming a silicon region continuous from the silicon substrate through the above opening portion to the insulating film by a simultaneous growth of silicon on both the single crystalline silicon substrate below the opening portion and on the polycrystalline silicon film (Polycrystalline epitaxially deposited silicon). The silicon on the insulating film is thereafter subjected to patterning by etching.

In the above-mentioned bipolar transistor, the base taking-out electrode consists of a polycrystalline silicon because polycrystalline silicon has an excellent workability and enables fine patterning and because it has an excellent adaptability for the self-aligning step. However, although electroconductivity may be imparted to polycrystalline silicon by the introduction of impurities at a high concentration, electroconductivity is still poor when compared with metals, etc., and therefore, a problem arises in that the base resistance becomes somewhat greater; refer to the example of the above bipolar transistor. Also, because it is necessary to introduce an impurity at a high concentration in order to make polycrystalline silicon electroconductive, the impurity will be diffused during subsequent heat treatment from the electroconductive polycrystalline silicon to the semiconductor substrate in contact therewith, whereby a problem arises in that the impurity always becomes highly concentrated in this region to sometimes give undesirable effects in element characteristics.

On the other hand, a metal is highly electroconductive and generally excellent as electrodes or wiring materials, but does not have a satisfactory workability for such as etching, or controllability, and accordingly, it can be used only with difficulty for a precise process such as the fabrication of the bipolar transistor as described above.

SUMMARY OF THE INVENTION

The object of the present invention is to remove the above-mentioned problems in the prior art.

In order to attain the above object, the present invention uses a selective growth of a metal or a metal silicide to form an electrode, wiring, etc.

Thus, the present invention resides in a process for fabricating a semiconductor device comprising the steps of: forming on a substrate an insulating layer having an opening portion and a layer which becomes the seed for growth of the metal or the metal silicide as hereinafter defined (hereinafter called "nucleating layer") on the insulating layer, the nucleating layer having a predetermined pattern, the pattern having an end periphery along at least a part of the end periphery of the opening portion of the insulating layer; and selectively growing a metal or a metal silicide on the substrate below the opening portion of the insulating layer and on the seed layer, to form on the insulating layer a metal or a metal silicide layer which has the predetermined pattern of the nucleating layer and is in contact with the substrate.

Referring to FIG. 2A, an insulating film 12 is formed on a substrate 11, for example, a semiconductor substrate, and the insulating film 12 has an opening portion 13. On the insulating film 12, a layer 14 as a nucleus for growth of a metal or a metal silicide is formed, and the layer 14 has an end periphery along at least a part of the end periphery of the opening portion 13 and already has a certain pattern. The insulating film 12 and the nucleating layer 14 may be formed in a conventional manner, or alternatively may be formed in the forms adapted for the respective purposes of various applications of the present invention, for example, according to the specific method as described later. However, the nucleating layer 14 must consist of a meterial on which a metal or a metal silicide can be selectively grown as well as on the substrate 11, and the insulating film 12 must be made of a meterial on which a metal or a metal silicide cannot be grown.

Referring to FIG. 2B, when a metal or a metal silicide 15a, 15b is grown selectively on the nucleating layer 14 and on the substrate 11 below the opening portion 13, the metal or the metal silicide 15 is first grown separately on the nucleating layer 14 and on the substrate 11 below the opening portion 13. However, as the growth continues, the metal or the metal silicide 15b growing in the opening portion 13 on the substrate 11 and the metal or the metal silicide 15a growing from the end periphery of the nucleating layer 14 existing along the end periphery of the opening portion 13 toward both the upper portion thereof and the opening portion 13 side, at last become continuous to each other.

As the growth further continues, as shown in FIG. 2C, a single metal or metal silicide layer 15 in contact with the substrate 11 and a desired pattern on the insulating film 12 is obtained.

Such a method for forming a metal or a metal silicide layer 15 is entirely novel. This method has the following characteristics or advantages.

(1) Since the layer is made of a metal or a metal silicide, it has high electroconductivity. Particularly, its electroconductivity is higher when compared with polycrystalline silicon. Therefore, it is very advantageous when used for electrode or wiring materials.

(2) No step for etching a metal or a metal silicide is required. Since the pattern of the metal or the metal silicide formed by this method is defined by the shape of the opening portion formed on the insulating film and the pattern of the seed layer formed on the insulating film, the metal or the metal silicide itself is not required to be subjected to etching for patterning. For example, the nucleating layer can be made of polycrystalline silicon, etc., and the insulating film can be made of SiO2, etc., and pattern formation (etching) of these can be done more easily and with better controllability, compared with the etching of a metal or a metal silicide. Accordingly, the severe formation conditions demanded by devices of various embodiments can be met more favorably when a metal or a metal silicide is to be used for electrode or wiring.

(3) In this method, when the substrate is a semiconductor layer and the electrodes made of a metal silicide layer, by formation of a diffusion region (16 in FIGS. 2A to 2C) in the semiconductor layer by introducing an impurity through the opening portion of the insulating film, the electrode window (opening portion of the insulating film), the diffusion region and the electrode can be formed in self-alignment with each other. Further, the electrode window (opening portion of the insulating film) and the pattern of the electrode (pattern of the nucleating layer) can be easily formed self-alignedly according to various methods including conventional and elaborate methods. These matters are also advantageous in assembling electrodes or wirings obtained by this method into various devices.

Thus, this method provides a new method for forming electrodes or wirings in a semiconductor device.

In this method, some of the methods for selective growth of a metal or metal silicide per se are already known and thus it is not particularly limited. For example, E. K. Broadbent and C. L. Ramiller report a selective growth of tungsten in "Selective Low Pressure Chemical Vapor Deposition of Tungsten" (Journal of Electrochemical Socient, SOLID STATE SCIENCE AND TECHNOLOGY, June, 1984, P. 1427–1433). According to this report, by CVD based on the reducing reaction of tungsten hexafluoride with hydrogen or silicon, tungsten grows selectively on single crystalline or polycrystalline silicon, but not on an insulating material such as $SiO_2$, $Si_4N_4$, etc. Suitable reaction conditions are stated to be a low temperature (250°–500° C.) and a low pressure (0.1–5 Torr), and hydrogen or argon is used together with tungsten hexafluoride as source gases. Also, Japanese Patent Application No. 60-23480 filed by Fujitsu Ltd. discloses a method of selective growth of titanium silicide. According to this patent application specification, an excellent titanium silicide can be grown selectively on silicon by the use of titanium tetrachloride and silane tetrachloride and hydrogen as source gases, and it will not grow on $SiO_2$, $Si_3N$, PSG, BPSG, etc. Preferable reaction conditions are a temperature of 600°–900° C. and a pressure of 100 Torr or lower.

In the above examples, single crystalline and polycrystalline silicon are used as the substrate for selective growth thereon, however growth is generally possible on the same material as the metal or the metal silicide to be grown.

Thus, the substrate is not limited to a semiconductor but it can be also a metal or a metal silicide. For example, when the substrate consists of a metal or a metal silicide and is a lower wiring layer or a taking-out electrode, it is possible to form an upper wiring layer or a proper wiring by selective growth of a metal or a metal silicide according to the present invention.

The present invention further provides a process for fabricating a bipolar transistor, which eliminates the problems described above in relation to the prior art. In this process, an insulating layer is formed on a first conductive type semiconductor substrate, an opening portion defining a base contact region surrounding an emitter region (shaped as an island) to be formed on this insulating layer is excavated, and a layer having a predetermined pattern extending outwardly from the outer peripheral of the opening portion (which forms the pattern of the base taking-out electrode combined with the opening portion) is formed on the insulating layer. The last layer is a layer which becomes the nucleus for selective growth of a metal or a metal silicide conducted in the later step (hereinafter called "nucleating layer"), and it can be made of a material which can become a nucleus for growth. At least, the same material as the above substrate could become the nucleus for growth. Also, based on the pattern of the above opening portion, a second conductive type dopant is introduced into the base contact region from the principal surface side of the substrate.

In this state, by permitting a metal or a metal silicide to grow under selected specific growth conditions, the metal or the metal silicide can be grown selectively on the substrate below the opening portion (base contact region), and on the above nucleating layer, without growth on the exposed portion of the above insulating layer. As a result of this selective growth, the metal or the metal silicide grown on the base contact region and the metal or the metal silicide grown on the nucleating layer become interated to form a base taking-out electrode with a metal or a metal silicide which is a good conductor.

Then, an insulating layer is formed on the exposed surface of the base taking-out electrode. This insulating layer can be formed preferably by anodic oxidation of the base taking-out electrode, but it is also possible to first deposit additively an insulating layer, followed by patterning. Subsequently, with the use of the insulating layer and the base taking-out electrode as the mask, in the region surrounded by the insulating layer, namely the region within the semiconductor substrate below the region corresponding to the island-shaped region inside of the above opening portion, an active base region adjacent to the base contact region is formed by introduction of a second conductive type dopant, and an emitter region is formed within the active base region by introduction of a first conductive type dopant.

Other steps can be the same as in the conventional method for production of a bipolar transistor, or various modifications may be made.

In this production process, since the base taking-out electrode is constituted of a metal or a metal silicide, its electroconductivity is high and the base resistance can be reduced.

Also, since the base contact region is formed in alignment with the pattern of the opening portion (base contact window) excavated first in the insulating layer on the semiconductor substrate and the base taking-out electrode is formed on the nucleating layer extending outwardly from the window in alignment with the base contact window, it is not necessary at all to make the area of the base contact region unnecessarily great for obtaining base contact.

Further, since the emitter region and the emitter electrode can be formed in alignment with the inner periphery of the base taking-out electrode formed by the selective growth method, it is not also necessary at all to make an area between the base contact region and the emitter region or an area for insulating separation between the base taking-out electrode and the emitter electrode unnecessarily great.

Thus, according to the process of the present invention, it is possible to form a base taking-out electrode and an emitter electrode by making the base region and the emitter region with necessary minimum areas and using a metal or a metal silicide. Therefore, a transistor having very good high frequency characteristics reduced in safety capacity and parasitic resistance can be obtained.

DESCRIPTION OF THE PREFERRED EMBODIMENTS

An example of fabricating a bipolar transistor in which a base taking-out electrode is formed by selective growth of a metal or a metal silicide is given below.

Figure 3A:
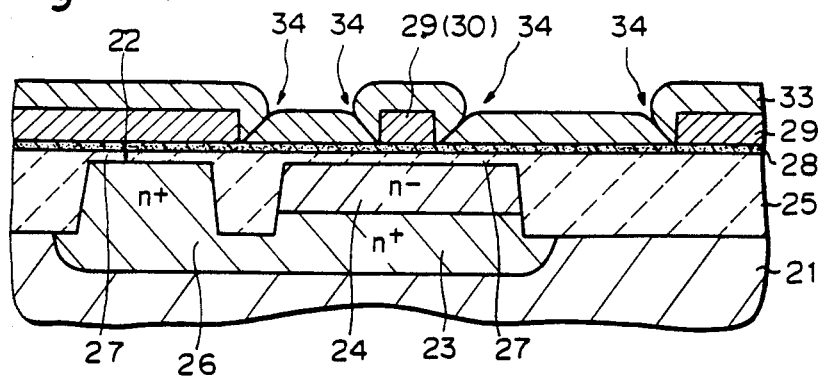
FIGS. 3A to 3I are sectional side views and a plan view (FIG. 3F only) of a bipolar transistor device in main steps of a process for fabricating the same in an example of the present invention; and, FIG. 4 is a sectional side view of MOS (metal-oxide-semiconductor) transistor device.

Referring to FIG. 3A, a single crystalline, silicon semiconductor substrate 21 having the principle surface 22, an $n^+$ type embedded layer 23, an $n^-$ type epitaxially grown single crystalline silicon layer 24, a locally oxidized film for separation 25, and an $n^+$ type collector contact region 16 are prepared according to a conventional method for fabricating a bipolar transistor. Further, an oxide film 27 with a thickness of about 0.1 $\mu$m is also formed on the surface not covered with the locally oxidized film 25 of the silicon semiconductor body including 21, 23, 24 and 26. The oxide film 27 may be prepared by oxidation of the silicon substrate surface or by the CVD method.

Figure 1:
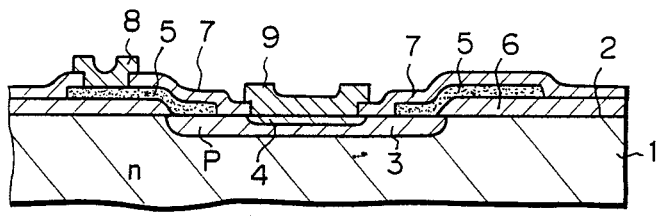
FIG. 1 is a sectional side view of a bipolar transistor in the prior art.
Figure 2A:
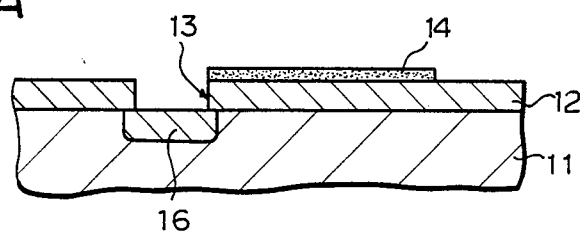
FIGS. 2A to 2C sectional side views of a semiconductor device in main steps of a process for fabricating the same according to the present invention.
Figure 2B:
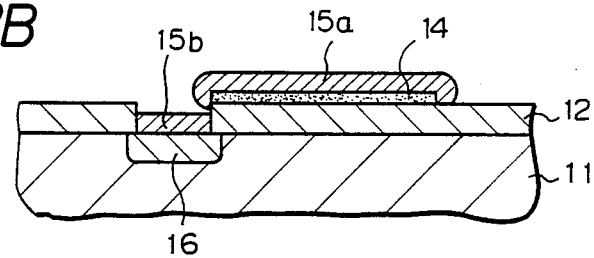
Figure 2C:
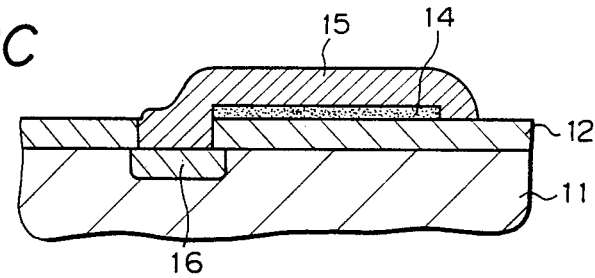

After a polycrystalline silicon layer 28 with a thickness of 0.1–0.3 $\mu$m is deposited on the oxide films 25 and 27 by the CVD method, and further a silicon nitride layer 29 with a thickness of about 0.3–0.5 $\mu$m is deposited thereon, the silicon nitride layer 29 is subjected to patterning to leave the emitter- forming portion (30 in FIG. 3F) and remove the base taking-out electrode forming portion (21 in FIG. 3F) which surrounds the emitter forming portion. The silicon nitride layer around the base taking-out electrode forming portion 31 (32 in FIG. 2F), is left. The dimensions of the emitter forming portion 30 may be, for example, 1.0 $\mu$m square.

Next, when, for example, a PSG layer 33 is deposited to a thickness of about 0.3–0.5 $\mu$m by CVD or low pressure CVD on the entire surface of the silicon nitride layer 29 and the polycrystalline silicon layer 28, a concavity or constriction 34 is formed in the layer 33 along the end periphery of the pattern of the silicon nitride layer 29 due to poor coverage at the stepped portion of the ground pattern.

Figure 3B:
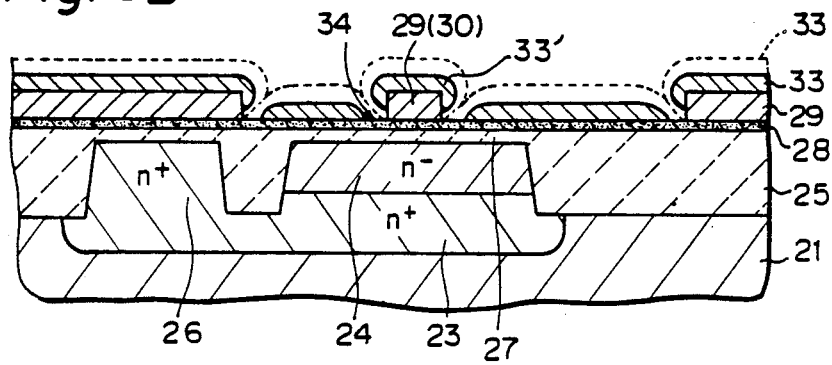

Referring to FIG. 3B, here the layer 33 is gradually subjected to wet etching by use of, for example, buffer hydrofluoric acid, etching proceeds from the surface of the layer 33 to gradually reduce the thickness of the layer 33, whereupon at the above concavity 34, namely at the outer peripheral portion of the emitter forming portion 30 and the outer peripheral portion of the base withdrawal electrode forming portion 31, etching progresses deeper than at the other portion 33', whereby the surface of the silicon nitride layer 29 and the polycrystalline silicon layer 28 becomes exposed only at that portion. Thus, an opening portion 34 is formed. The opening width of the opening portion 34 is determined by the thickness of the silicon nitride layer 29, the conditions for forming the layer 33, the conditions for etching the layer 33, and the etched thickness of the layer 33, but finally an opening portion 34 with a desired opening width can be formed within a certain range by appropriately selecting the time at which etching of the layer 33 is stopped. For example, here there is an opening width of 0.2–0.3 $\mu$m.

Figure 3C:
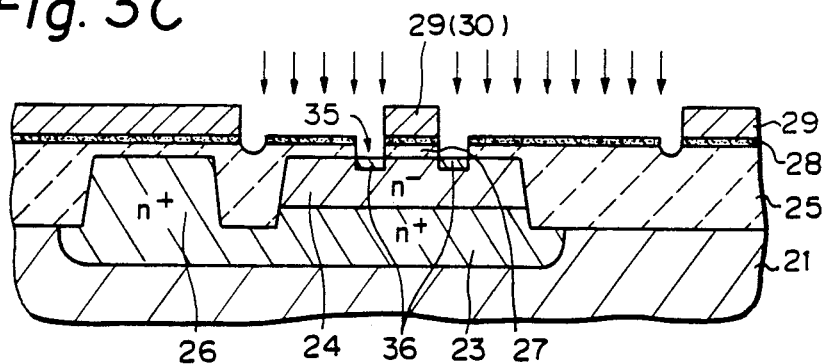

Referring to FIG. 3C, etching of the polycrystalline silicon layer 28 with the remaining layer 33 acting as the mask results in selective etching only of the portion 35 below the opening portion 34. Subsequently, the layer 33' is removed, whereby, as a consequence, the portions of the oxide films 25 and 27 exposed by the prior etching of the polycrystalline silicon layer 28 are also etched. This is because the layer 33' is made of PSG, while the oxide films 25 and 27 are made of SiO$_2$. Then, by implantation of boron ions (B+) over all the surface, boron ions can be implanted selectively into the n⁻-type epitaxial layer 24 only in the base contact region 36 below the above opening portion 35 along the outer periphery of the emitter forming portion 30 due to the action of the silicon nitride layer 29 and the polycrystalline silicon layer 28 at the mask, whereby at the same time boron ions are selectively implanted into the polycrystalline silicon layer 24 at the base taking-out electrode forming portion 31 due to the action of the silicon nitride layer 29 as the mask. The implantation conditions may be, for example, 30–40 keV, and $1 \times 10^{14}$ cm$^{-2}$.

Figure 3D:
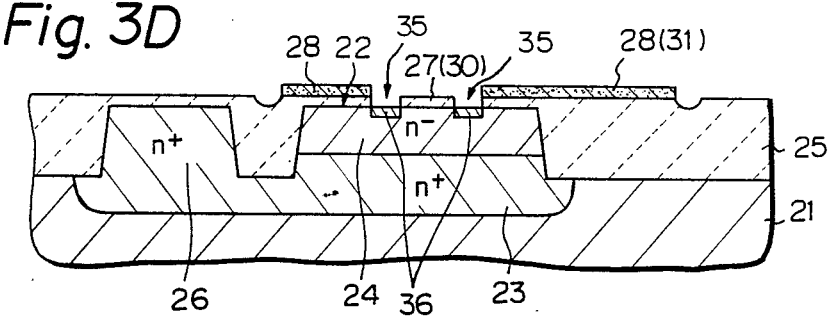

Referring to FIG. 3D, after etching removal of the silicon nitride layer 29, the polycrystalline silicon layer 28 is etched with potassium hydroxide, and the polycrystalline silicon layer 28 remains selectively only at the base taking-out electrode forming portion 31 because the etching speed for the portion implanted selectively with boron ions in the above step is lowered.

The structure shown in FIG. 3D thus obtained has the insulating layer (oxide film) 27 on the principal surface 22 of the n⁻ type epitaxial silicon layer 24 on which an emitter region and a collector region are to be formed, the insulating layer 27 having an opening portion 35 surrounding the island-shaped emitter forming portion (30) along the outer peripheral portion thereof and a layer (polycrystalline silicon layer) 28 with a predetermined pattern (the pattern which should form the base taking-out electrode) extended outwardly from the outer periphery of the opening portion 35 on the insulating layer 27. The single crystalline silicon in the region 36 and the polycrystalline silicon in the layer 28 are substances which become the seed for a selective growth of tungsten, etc., as hereinafter described. No tungsten, etc., will grow on SiO$_2$ of layers 25 and 27. The process of the present invention is specific in that the base withdrawal electrode is prepared by selective growth of a metal or a metal silicide with such a structure as the starting point. Accordingly, a series of the steps as explained by referring to FIGS. 3A to 3D is only an example of the steps for obtaining the structure as shown in FIG. 3D. However, in the series of steps, the base contact region or the base contact window is obtained adjacent to the pattern of the emitter forming portion in submicron order and besides, the structure as shown in FIG. 3D can be advantageously obtained with the pattern of the silicon nitride layer 29 in FIG. A as the starting point, following subsequently all the self-alignment processes.

Figure 3E:
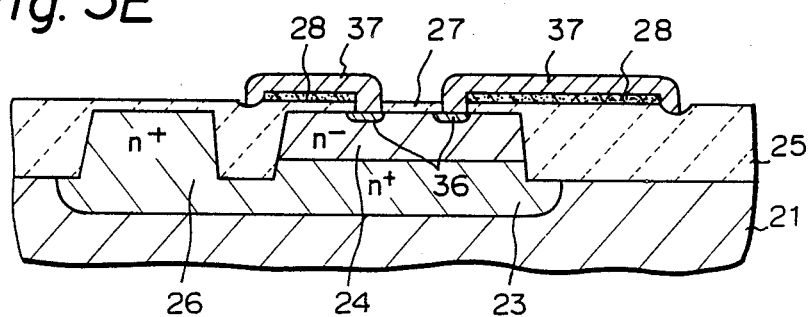

Referring to FIG. 3E, for example, tungsten is grown selectively on the epitaxially grown single crystalline silicon 36 (24) exposed below the opening portion 35 and on the polycrstalline silicon layer 28. For example, according to CVD at a low temperature of 250°–500° C. under a low pressure of 0.1–5 Torr, tungsten can be selectively grown from a mixture of tungsten fluoride (WF6) with argon or hydrogen [(see J. Ecs., June, 1984, P. 1427-1433), (see "Selective Low Pressure Chemical Vapor Deposition Method of Tungsten" by E. K. Broadbent at al, supra, etc.]

Thus, after selective growth of tungsten of the base contact region 36 and polycrystalline silicon layer 28, tungsten growing on these two regions become finally integrated to form a base taking-out electrode 37. At this time, the tungsten layer, namely the base taking-out electrode 37, has a thickness of, for example, about 0.3–0.5 μm.

Figure 3F:
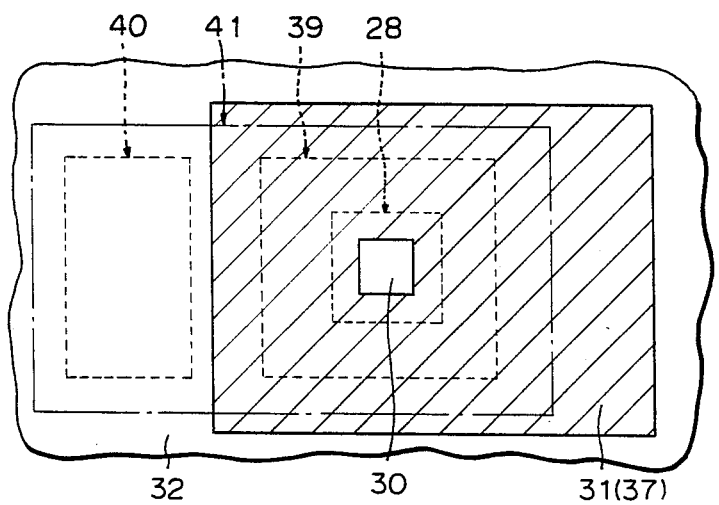

FIG. 3F is a plan view of FIG. 3E. In this Figure, the dashed portion 37 is the base taking-out electrode, the broken line 38 the outer periphery of the base contact region 36, the broken line 39 the outer periphery of the n⁻-type epitaxial layer 34, the broken line 40 the outer periphery of the n+ type collector contact region 36 and the chained line 41 the outer periphery of the n+-type embedded layer 23.

Figure 3G:
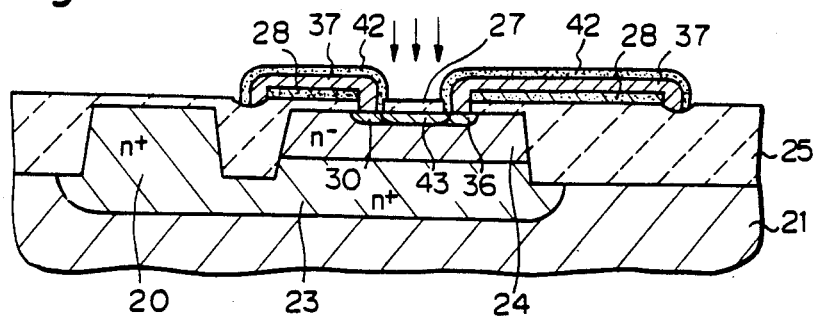

Referring to FIG. 3G, the surface 42 of the base taking-out electrode 37 comprising a metal or a metal silicide is oxidized anodically so that it is insulated. Next, boron ions (B+) are implanted selectively into the active base region 43 with the base taking-out electrode 37 as the mask under the conditions of about 30–40 KeV and $5 \times 10^{13}$ cm$^{-2}$. During this operation, although not shown in the Figure, the collector contact region is masked with a resist in order to avoid implantation of ions thereinto.

Figure 3H:
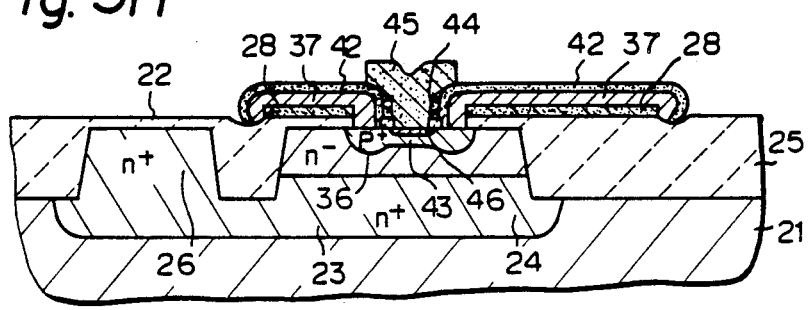

Referring to FIG. 3H, emitter diffusion may be effected immediately, but an insulating film 44 with a desired width is provided inside of the inner periphery of the insulating layer 42 in order to avoid inclusion of the outer periphery of the emitter region into the highly concentrated base contact region. This insulating film 44 can be formed by, for example, depositing SiO$_2$ on the whole surface by CVD and then carrying out anisotropic etching in the direction perpendicular to the principal surface 22 by, for example, reactive ion etching. Since the portion attached to the vertical wall of the step has a thickness with respect to the milling direction (direction perpendicular to the principal surface 22) which is greater when compared with that on the flat insulating layer 42 and on the active base region 43, SiO$_2$ remains in the latter portion even if the former portion is removed by etching. During this operation, by controlling the amount of etching, the thickness in the lateral direction of the insulating film 44 can be controlled. Also, similar operations can be repeated. Then, a polycrystalline silicon layer 45 doped with arsenic at, for example, about $10^{20}$ cm$^{-3}$, is formed inside of the insulating film 44 on the epitaxial silicon layer 24 and, by carrying out heat treatment of, for example, 950°–1000° C., for about 30 minutes, arsenic is diffused through the principal surface 22 from the doped polycrystalline silicon layer 45 to form an emitter region 46 with a depth of about 0.15 μm. During the heat treatment, the boron ions previously implanted in the base regions 36 and 43 are also activated at the same time. The base contact region 36 and the active base region 43 become integrated, and the active base region 43 then has a depth of about 0.3 μm. (Here it is clear that the emitter region 46 may be formed by ion implantation, and the emitter electrode may be formed of aluminum, etc., on the principal surface 22).

Figure 3I:
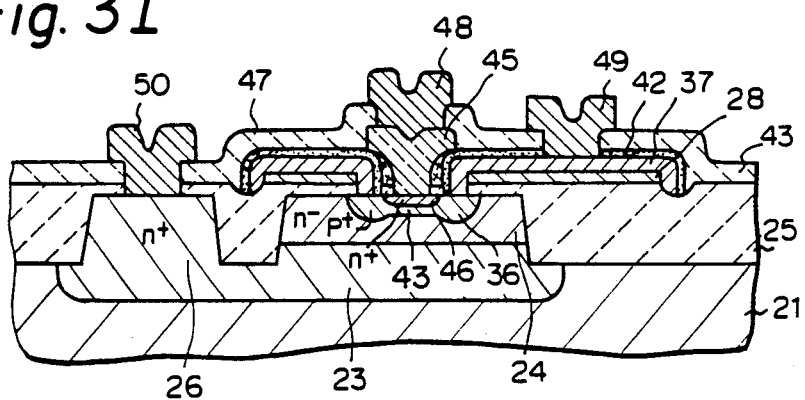

Referring to FIG. 3I, subsequently, according to conventional methods, an insulating film 47, an emitter electrode 48, a base electrode 49 and a collector electrode 50 are formed. As shown in this Figure, the base electrode 49 is connected to the base taking-out electrode 37.

In the series of steps of FIG. 3D et seq, the outer periphery of the base contact region 36, and therefore, also the outer periphery of the base region as a whole (36+43) and the inner periphery of the base taking-out electrode 37 are defined in alignment with the outer peripery of the opening portion 35, and the inner periphery of the base contact region 36 and the outer periphery of the emitter region 46 are defined in alignment with the inner periphery of the opening portion 35. Thus, since the area of the base region surrounding the emitter region is defined only by the pattern of the opening portion 35, the area can be made smaller with ease. Moreover, since the pattern of the opening portion 35 can be formed with good precision in submicron order only from the pattern of the emitter forming portion of the silicon nitride layer 29 by combination with the steps of FIGS. 3A to 3D as described above, the area of the base region can be made the necessary minimum size.

Also, since the base taking-out electrode of the bipolar transistor obtained according to this process does not consist of a polycrystalline silicon of the example in the prior art, but of a metal or a metal silicide, it has high electroconductivity, thus cancelling the problem that the resistance of the base taking-out electrode worsens the transistor characteristics or the high frequency characteristics of a bipolar transistor are improved.

Also, in this process, the base taking-out electrode is formed of a metal or a metal silicide, and therefore, not only is mask alignment not required, but also a step for etching a metal or a metal silicide to form the base taking-out electrode is not required. This is an advantage of the process of the present invention in view of the poor etching controllability of a metal or a metal silicide.

Although the above description includes examples of the present invention, the present invention can be modified in various ways. For example, the opening portion provided in the insulating layer on the semiconductor body may be formed according to any desired method, and may have any desired shape and dimensions. The method for doping the base contact region, the active base region and the emitter region (ion implantation or heat diffusion), the kind of dopant, the forming conditions, and the order of formation of the active base region and the emitter region, are not limited. The materials for the insulating layer and the seed for growth during selective growth may be selected appropriately depending on the metal or the metal silicide employed for selective growth and its growth conditions. The insulating layer on the surface of the base taking-out electrode can be formed according to a method other than anodic oxidation, such as the CVD method, etc.

Figure 4:
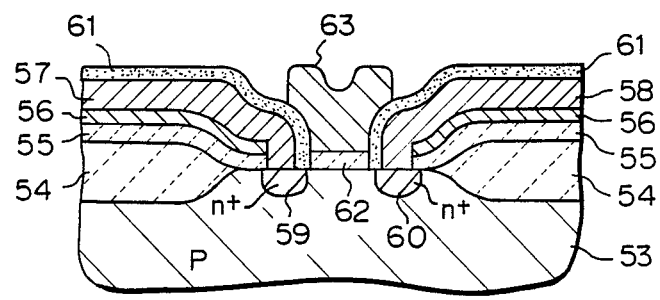

The process of the present invention is not limited to the case of the process of the bipolar transistor as described above, but is clearly applicable for many processes. For example, FIG. 4 shows an example of a MOS transistor, wherein 53 shows a p-type silicon substrate, 54 and element separating oxide film, 55 an $SiO_2$ film, 56 a polycrystalline silicon layer (layer for the seed for growth of a metal or a metal silicide), 57 a source electrode, 58 a drain electrode, 59 an $n^+$-type source region, 60 an $n^+$-type drain region, 61 an insulating film, 62 a gate oxide film, and 63 a gate electrode. By comparison of this Figure with FIG. 3I, it is apparent that this MOS transistor can be easily prepared according to a process similar to the process explained by referring to FIGS. 3A to 3I. However, in this example, in place of the base taking-out electrode, a source electrode and a drain electrode are formed as separate patterns. This can be accomplished by merely changing the pattern of the silicon nitride film in the example shown in FIGS. 3A to 3C.

We claim:

1. A process for fabricating a semiconductor device on a silicon substrate of a first conductivity type, comprising the steps of:

forming first and second insulating layers, resistant to metal or metal-silicide growth thereon, on the silicon substrate, the first insulating layer being shaped as an island, the second insulating layer being separated from the first insulating layer by a trench portion having a bottom surrounding the first insulating layer;

forming a silicon seed layer having a predetermined pattern on the second insulating layer;

forming a base region, of a second conductivity type opposite to the first conductivity type, on the silicon substrate below the trench portion, an exposed portion of the base region forming the bottom of the trench;

selectively growing a metal or a metal silicide on the base region exposed below the trench portion and on the silicon seed layer, but not on the first insulating layer, forming a base taking-out electrode having the predetermined pattern on the second insulating layer and in contact with the base region;

forming a third insulating layer on an exposed surface of the base taking-out electrode;

forming an active base region of the second conductivity type and an emitter region of the first conductivity type in the substrate below a region surrounded by the base taking-out electrode and the third insulating layer from the principal surface into the inside thereof, the active base region being in contact with the base region, the emitter region being formed in the active base region; and forming a collector region using a region of the first conductivity type in the substrate and in contact with the active base region.

* * * * *

UNITED STATES PATENT AND TRADEMARK OFFICE
CERTIFICATE OF CORRECTION

PATENT NO. : 4,952,521

DATED : AUGUST 28, 1990

INVENTOR(S) : HIROSHI GOTO

It is certified that error appears in the above-identified patent and that said Letters Patent is hereby corrected as shown below:

FRONT PAGE [63] Line 3, before "Apr. 23," insert --filed--;

[56] Col. 2, "OTHER PUBLICATIONS";

Line 3, "pf" should be --of--;
Line 4, "(Koka)" should be --(Kokai)--;
Line 9, "31-237." should be --231-237.--;

[57] ABSTRACT,

Line 5, "external" should be deleted;
Line 6, "base (36)" should be --in--.

Col. 6, line 14, "region 16" should be --region 26--.

Signed and Sealed this

Seventh Day of January, 1992

Attest:

HARRY F. MANBECK, JR.

*Attesting Officer*     *Commissioner of Patents and Trademarks*